United States Patent [19]

Park et al.

[11] Patent Number: 5,754,418

[45] Date of Patent: May 19, 1998

[54] HIGH VOLTAGE GENERATION CIRCUIT FOR SEMICONDUCTOR MEMORY DEVICE

[75] Inventors: Jin Ho Park; Jae Ik Doh; Dong Sik Jeong, all of Ichon-shi, Rep. of Korea

[73] Assignee: Hyundai Electronics Industries Co., Ltd., Ichon-shi, Rep. of Korea

[21] Appl. No.: 742,682

[22] Filed: Oct. 31, 1996

[30] Foreign Application Priority Data

Nov. 1, 1995 [KR] Rep. of Korea .............. 95 39156

[51] Int. Cl.$^6$ .............................. H02M 3/18; G11C 7/00; G05F 3/02; G01R 31/26
[52] U.S. Cl. .............................. 363/60; 365/201; 327/536; 324/765
[58] Field of Search ............. 363/60; 365/189.01, 365/189.07, 201; 327/536, 538; 324/765

[56] References Cited

U.S. PATENT DOCUMENTS

| | | | |
|---|---|---|---|
| 4,809,230 | 2/1989 | Konishi et al. | 365/189.11 |
| 5,063,304 | 11/1991 | Iyengar | 327/296.6 |
| 5,349,559 | 9/1994 | Park et al. | 327/201 |
| 5,373,472 | 12/1994 | Ohsawa | 365/201 |
| 5,396,113 | 3/1995 | Park et al. | 327/543 |
| 5,424,629 | 6/1995 | Fujiwara et al. | 323/349 |
| 5,452,253 | 9/1995 | Choi | 365/201 |
| 5,467,356 | 11/1995 | Choi | 371/21.1 |
| 5,510,749 | 4/1996 | Arimoto | 327/546 |
| 5,530,640 | 6/1996 | Hara et al. | 363/60 |
| 5,592,115 | 1/1997 | Kassapian | 327/239 |
| 5,617,044 | 4/1997 | Takamoto | 327/77 |
| 5,642,072 | 6/1997 | Miyamoto et al. | 327/535 |

*Primary Examiner*—Peter S. Wong
*Assistant Examiner*—Bao Q. Vu
*Attorney, Agent, or Firm*—Reid & Priest LLP

[57] ABSTRACT

A high voltage generation circuit for a semiconductor memory device comprising a high voltage detector for detecting a high voltage, a ring oscillator for generating a pulse signal in response to an output signal from the high voltage detector when a power-up signal is made active, a high voltage pump circuit for performing a charge pumping operation to generate the high voltage and transfer the generated high voltage to a high voltage output terminal, and a pump controller for controlling the charge pumping operation of the high voltage pump circuit in response to the pulse signal from the ring oscillator. The high voltage generation circuit further comprises an operating voltage detector for detecting whether an external voltage from an external voltage source has an operating voltage level, a burn-in test voltage detector for detecting whether the external voltage from the external voltage source has a level higher than the operating voltage level, a switching circuit for transferring the external voltage from the external voltage source to the high voltage output terminal, and a driver for selectively driving the high voltage detector and the switching circuit in response to output signals from the operating voltage detector and burn-in test voltage detector.

17 Claims, 11 Drawing Sheets

HIGH VOLTAGE GENERATION CIRCUIT FOR SEMICONDUCTOR MEMORY DEVICE

BACKGROUND OF THE INVENTION

1. Field of the Invention

The present invention relates in general to high voltage generation circuits for semiconductor memory devices, and more particularly to a high voltage generation circuit which is capable of, when an external voltage has an operating voltage level, supplying it directly as a high voltage without operating a pump circuit, to reduce the power consumption amount.

2. Description of the Prior Art

Generally, in order to operate a semiconductor memory device such as a dynamic random access memory (referred to hereinafter as DRAM), internal voltages Vbb, Vpp and Vxg are required in addition to external supply voltages Vdd and Vcc.

The internal voltage Vbb is a substrate voltage used as a back gate bias voltage to an NMOS transistor, which has a negative level. The internal voltage Vpp is a high voltage for making a word line active, which has a level higher than those of the drive voltages Vdd and Vcc by a threshold voltage or more. When a gate of an NMOS transistor is bootstrapped to make the word line active to the full high voltage Vpp in the case where a word line driver (row decoder) is of the NMOS type, the internal voltage Vxg is a voltage applied to a gate of another NMOS transistor for the bootstrap operation, which has a level of Vcc+Vt (threshold voltage) or more. Namely, the internal voltage Vxg takes an intermediate value between the high voltage Vpp and the supply voltage Vcc to have the effect of raising the bootstrap level. Usually, the internal voltage Vxg is generated by a voltage divider which divides the high voltage Vpp using a simple resistor.

The high voltage Vpp is generated by a high voltage generation circuit which supplies the high voltage Vpp to the word line. Because one cell transistor constituting a DRAM cell is of the NMOS type, the high voltage generation circuit generates the high voltage Vpp in consideration of a current loss due to the threshold voltage Vt. At this time, the generated high voltage Vpp has a level of Vcc+Vt+ΔV.

Generally, the high voltage Vpp from the high voltage generation circuit is used to make the word line of the memory device active. Also, a signal is required to select one of two bit lines when two blocks share a sense amplifier with each other. Such a signal must drive an NMOS transistor acting as a switch. As a result, the high voltage Vpp is used as such a signal to remove a loss resulting from the threshold voltage. Further, the high voltage Vpp is used in a data output buffer of the NMOS transistor drive type.

FIG. 1 is a block diagram illustrating the construction of a conventional high voltage generation circuit for a semiconductor memory device. As shown in this drawing, the conventional high voltage generation circuit comprises a high voltage detector 11 for detecting a high voltage Vpp, a ring oscillator 12 for generating a pulse signal in response to an output signal from the high voltage detector 11 when a power-up signal Pwrup is made active, a high voltage pump circuit 14 for performing a charge pumping operation to generate the high voltage Vpp and transfer the generated high voltage Vpp to a high voltage output terminal 15, and a pump controller 13 for controlling the charge pumping operation of the high voltage pump circuit 14 in response to the pulse signal from the ring oscillator 12.

The operation of the conventional high voltage generation circuit for the semiconductor memory device with the above-mentioned construction will be described hereinafter.

First, upon the application of power to a DRAM chip, a substrate voltage pump circuit (not shown) begins to operate, in order to generate the substrate voltage Vbb. When the substrate voltage Vbb reaches a predetermined level, the power-up signal Pwrup is made active to indicate such a situation. The ring oscillator 12 begins to operate in response to the active power-up signal Pwrup to generate the pulse signal. The pump controller 13 controls the charge pumping operation of the high voltage pump circuit 14 in response to the pulse signal from the ring oscillator 12 to generate the high voltage Vpp. When the high voltage Vpp reaches a predetermined level, the high voltage detector 11 stops the operation of the ring oscillator 12, thereby causing the high voltage pump circuit 14 to perform no further operation. With this operation repeated, the high voltage Vpp from the high voltage generation circuit is maintained at a level having a constant difference with respect to the internal voltage level.

However, in the above-mentioned conventional high voltage generation circuit, the high voltage detector 11, the ring oscillator 12, the pump controller 13 and the high voltage pump circuit 14 must all be operated to obtain the desired high voltage Vpp, resulting in the consumption of a considerable amount of power.

SUMMARY OF THE INVENTION

Therefore, the present invention has been made in view of the above problem, and it is an object of the present invention to provide a high voltage generation circuit for a semiconductor memory device which is capable of supplying it directly as a high voltage without operating a pump circuit, to reduce a power consumption amount, when an external voltage has an operating voltage level.

In accordance with one aspect of the present invention, a high voltage generation circuit for a semiconductor memory device comprises high voltage detection means for detecting a high voltage, ring oscillation means for generating a pulse signal in response to an output signal from said high voltage detection means when a power-up signal is made active, high voltage pump means for performing a charge pumping operation to generate the high voltage and transfer the generated high voltage to a high voltage output terminal, and pump control means for controlling the charge pumping operation of said high voltage pump means in response to the pulse signal from said ring oscillation means, wherein the improvement comprises operating voltage detection means for detecting whether an external voltage from an external voltage source has an operating voltage level; burn-in test voltage detection means for detecting whether the external voltage from said external voltage source has a level higher than the operating voltage level; switching means for transferring the external voltage from said external voltage source to said high voltage output terminal; and drive means for selectively driving said high voltage detection means and said switching means in response to output signals from said operating voltage detection means and burn-in test voltage detection means.

In accordance with another aspect of the present invention, a high voltage generation circuit for a semiconductor memory device comprises high voltage detection means for detecting a high voltage, ring oscillation means for generating a pulse signal in response to an output signal from said high voltage detection means when a power-up signal is made active, high voltage pump means for performing a charge pumping operation to generate the high voltage and transfer the generated high voltage to a high voltage output terminal, and pump control means for controlling the charge pumping operation of said high voltage pump means in response to the pulse signal from said ring oscillation means, wherein the improvement comprises operating voltage detection means for detecting whether an external voltage from an external voltage source has an operating voltage level; burn-in test voltage detection means for detecting whether the external voltage from said external voltage source has a level higher than the operating voltage level; switching means for transferring the external voltage from said external voltage source to said high voltage output terminal; and drive means for selectively driving said ring oscillation means and said switching means in response to output signals from said operating voltage detection means and burn-in test voltage detection means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
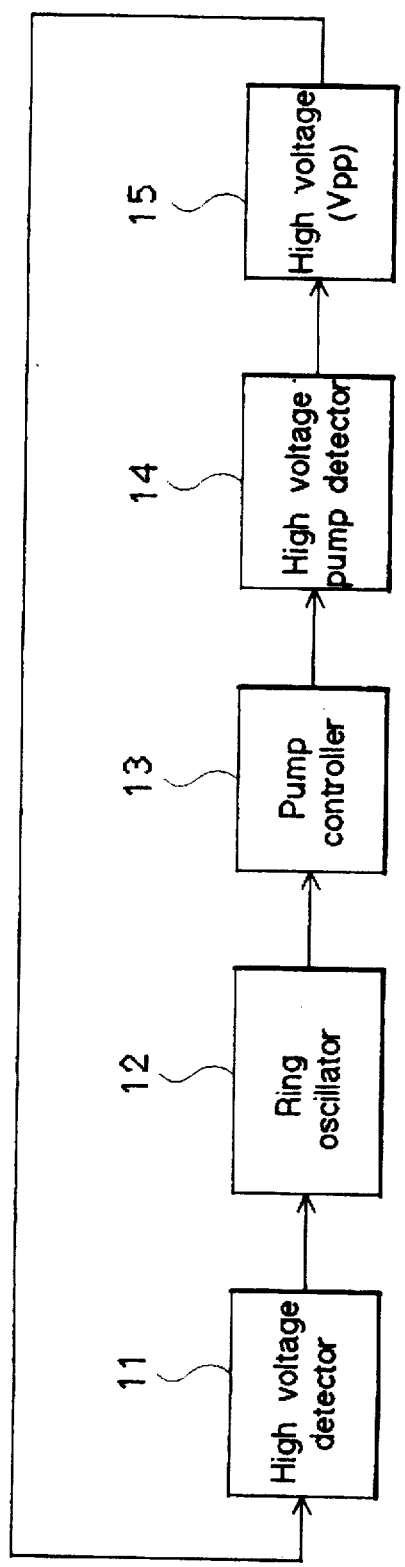
FIG. 1 is a block diagram illustrating the construction of a conventional high voltage generation circuit for a semiconductor memory device.
Figure 2:
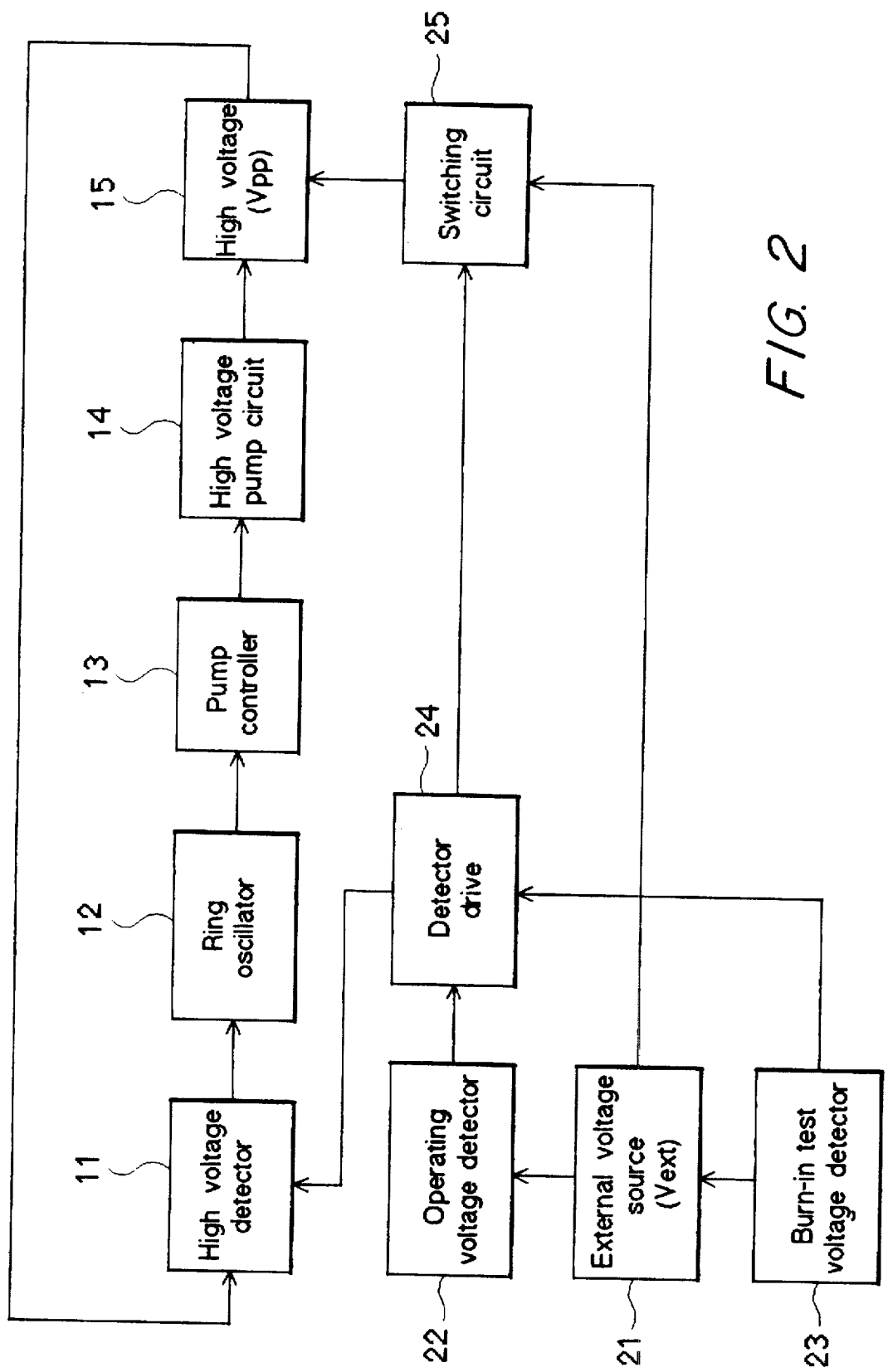
FIG. 2 is a block diagram illustrating the construction of a high voltage generation circuit for a semiconductor memory device in accordance with an embodiment of the present invention.

Referring to FIG. 2, the construction of a high voltage generation circuit for a semiconductor memory device in accordance with an embodiment of the present invention is shown in block. As indicated by this drawing, the high voltage generation circuit comprises a high voltage detector 11 for detecting a high voltage Vpp, a ring oscillator 12 for generating a pulse signal in response to an output signal from the high voltage detector 11 when a powerup signal Pwrup is made active, a high voltage pump circuit 14 for performing a charge pumping operation to generate the high voltage Vpp and transfer the generated high voltage Vpp to a high voltage output terminal 15, and a pump controller 13 for controlling the charge pumping operation of the high voltage pump circuit 14 in response to the pulse signal from the ring oscillator 12.

The high voltage generation circuit further comprises an operating voltage detector 22 for detecting whether an external voltage Vext from an external voltage source 21 has an operating voltage level, a burn-in test voltage detector 23 for detecting whether the external voltage Vext from the external voltage source 21 has a level higher than the operating voltage level, a switching circuit 25 for transferring the external voltage Vext from the external voltage source 21 to the high voltage output terminal 15, and a detector driver 24 for selectively driving the high voltage detector 11 and the switching circuit 25 in response to output signals from the operating voltage detector 22 and burn-in test voltage detector 23.

The operation of the high voltage generation circuit for the semiconductor memory device with the above-mentioned construction in accordance with the embodiment of the present invention will hereinafter be described in detail.

In the high voltage generation circuit, the operating voltage detector 22 and the burn-in test voltage detector 23 detect the level of the external voltage Vext from the external voltage source 21 and output the detected results to the detector driver 24. In response to the detected results from the operating voltage detector 22 and burn-in test voltage detector 23, the detector driver 24 determines which one of the high voltage detector 11 and switching circuit 25 will be driven. When the level of the external voltage Vext from the external voltage source 21 is lower than the operating voltage level, the detector driver 24 drives the high voltage detector 11, thereby allowing the high voltage pump circuit 14 to be operated in response to the output signal from the ring oscillator 12. In the case where the external voltage Vext from the external voltage source 21 has the operating voltage level, the detector driver 24 drives the switching circuit 25 to transfer the external voltage Vext from the external voltage source 21 to the high voltage output terminal 15. When the level of the external voltage Vext from the external voltage source 21 is higher than the operating voltage level, the detector driver 24 stops the operation of the switching circuit 25 and drives the high voltage detector 11. As a result, the high voltage pump circuit 14 is operated in response to the output signal from the ring oscillator 12.

Figure 3:
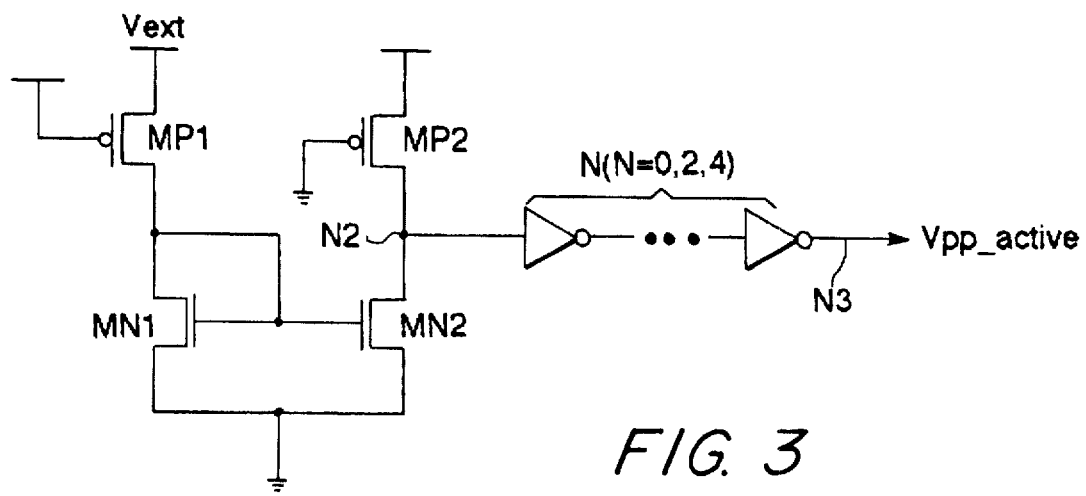
FIG. 3 is a circuit diagram of an operating voltage detector in FIG. 2.

FIG. 3 is a circuit diagram of the operating voltage detector 22 in FIG. 2. As shown in this drawing, the operating voltage detector 22 includes a PMOS transistor MP1 connected between the external voltage source 21 and a node N1, a PMOS transistor MP2 connected between a supply voltage source Vcc and a node N2, an NMOS transistor MN1 connected between the node N1 and a ground voltage source Vss, and an NMOS transistor MN2 connected between the node N2 and the ground voltage source Vss. The PMOS transistor MP1 has its gate connected to the supply voltage source Vcc and the PMOS transistor MP2 has its gate connected to the ground voltage source Vss. The NMOS transistors MN1 and MN2 have their gates connected in common to the node N1.

The operating voltage detector 22 further includes an even number of inverters connected in series between the node N2 and an output node N3.

The operation of the operating voltage detector 22 with the above-mentioned construction in accordance with the embodiment of the present invention will hereinafter be described in detail.

When the external voltage Vext from the external voltage source 21 has the operating voltage level, the PMOS transistor MP1 and the NMOS transistors MN1 and MN2 are turned on, thereby causing a signal at the node N2 to go from high to low in logic. As a result, an output signal Vpp_active at the output node N3 is made active from high to low in logic. The PMOS transistor MP1 always remains at its ON state when the level of the external voltage Vext from the external voltage source 21 is higher than or equal to the operating voltage level. In this case, the output signal Vpp_active at the output node N3 is always low in logic.

Figure 4:
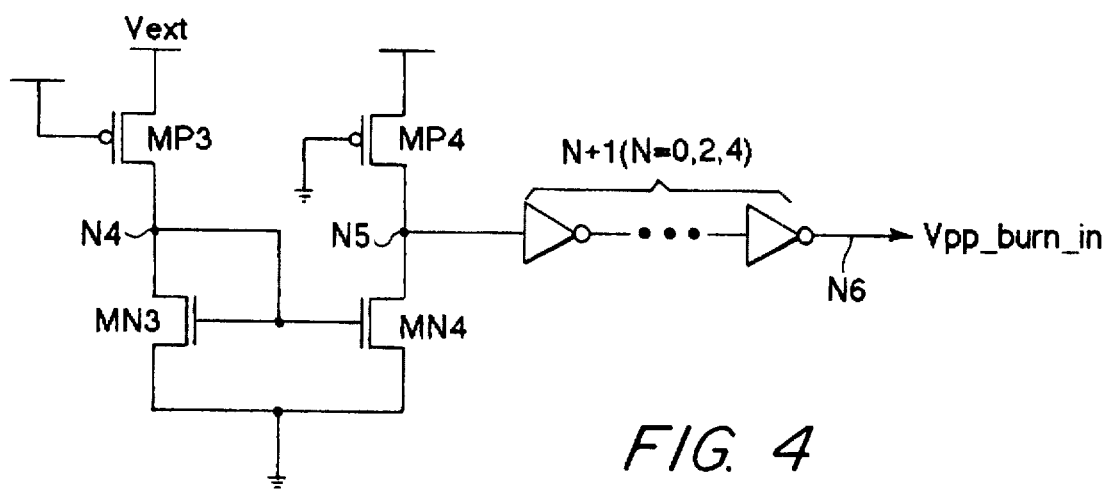
FIG. 4 is a circuit diagram of a burn-in test voltage detector in FIG. 2.

FIG. 4 is a circuit diagram of the burn-in test voltage detector 23 in FIG. 2. As shown in this drawing, the burn-in test voltage detector 23 includes a PMOS transistor MP3 connected between the external voltage source 21 and a node N4, a PMOS transistor MP4 connected between the supply voltage source Vcc and a node N5, an NMOS transistor MN3 connected between the node N4 and the ground voltage source Vss, and an NMOS transistor MN4 connected between the node N5 and the ground voltage source Vss. The PMOS transistor MP3 has its gate connected to the supply voltage source Vcc and the PMOS transistor MP4 has its gate connected to the ground voltage source Vss. The NMOS transistors MN3 and MN4 have their gates connected in common to the node N4.

The burn-in test voltage detector 23 further includes an odd number of inverters connected in series between the node N5 and an output node N6.

The operation of the burn-in test voltage detector 23 with the above-mentioned construction in accordance with the embodiment of the present invention will hereinafter be described in detail.

When the level of the external voltage Vext from the external voltage source 21 is higher than the operating voltage level, the PMOS transistor MP3 and the NMOS transistors MN3 and MN4 are turned on, thereby causing a signal at the node N5 to go from high to low in logic. As a result, an output signal Vpp_burn-in at the output node N6 is made active from low to high in logic. In the case where the level of the external voltage Vext from the external voltage source 21 is lower than the operating voltage level, the PMOS transistor MP3 is turned off. In this case, the output signal Vpp_burn-in at the output node N6 is low in logic.

Figure 5:
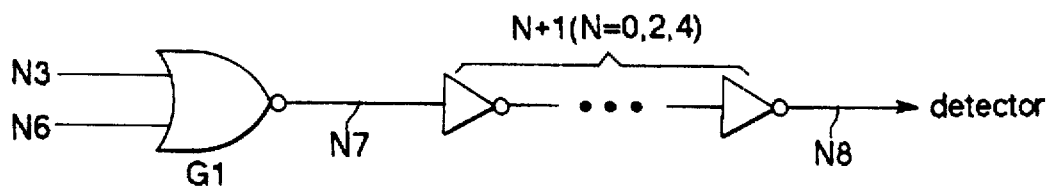
FIG. 5 is a circuit diagram of a detector driver in FIG. 2.

FIG. 5 is a circuit diagram of the detector driver 24 in FIG. 2. As shown in this drawing, the detector driver 24 includes a NOR gate G1 for NORing the output signal Vpp_active at the output node N3 of the operating voltage detector 22 and the output signal Vpp_burn-in at the output node N6 of the burn-in test voltage detector 23 and outputting the NORed result to a node N7, and an odd number of inverters connected in series between the node N7 and an output node N8.

The operation of the detector driver 24 with the above-mentioned construction in accordance with the embodiment of the present invention will hereinafter be described in detail with reference to FIG. 6.

The detector driver 24 outputs a high or low logic signal Detector at its output node N8 in response to the output signal Vpp_active at the output node N3 of the operating voltage detector 22 and the output signal Vpp_burn-in at the output node N6 of the burn-in test voltage detector 23. The high logic signal Detector at the output node N8 allows the high voltage pump circuit 14 to be driven to transfer the high voltage Vpp to the high voltage output terminal 15. The low logic signal Detector at the output node N8 allows the switching circuit 25 to be driven to transfer the external voltage Vext from the external voltage source 21 to the high voltage output terminal 15.

Figure 6:
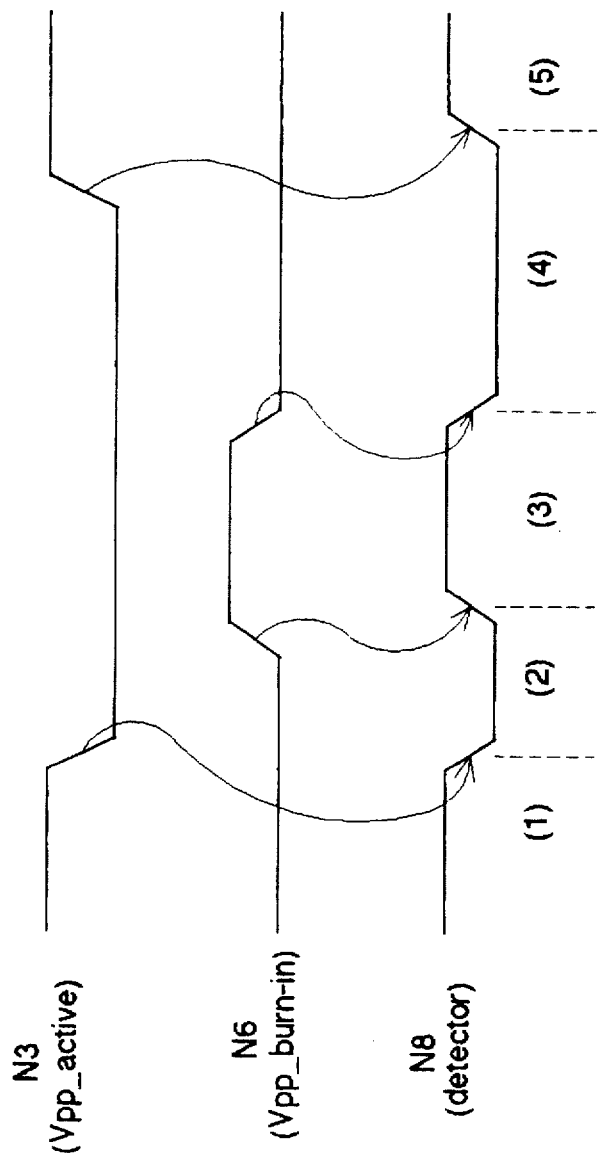
FIG. 6 is a timing diagram illustrating the operation of the detector driver in FIG. 5.

FIG. 6 is a timing diagram illustrating the operation of the detector driver 24 in FIG. 5. In this drawing, the interval (1) shows the operation of the detector driver 24 when the level of the external voltage Vext from the external voltage source 21 is lower than the operating voltage level. In this case, the switching circuit 25 is turned off, whereas the high voltage detector 11 is turned on. As a result, the high voltage pump circuit 14 is driven to transfer the high voltage Vpp to the high voltage output terminal 15.

The interval (2) shows the operation of the detector driver 24 when the level of the external voltage Vext from the external voltage source 21 is equal to the operating voltage level. In this case, the switching circuit 25 is turned on, whereas the high voltage detector 11 is turned off. As a result, the high voltage pump circuit 14 is stopped in operation and the external voltage Vext from the external voltage source 21 is transferred to the high voltage output terminal 15.

The interval (3) shows the operation of the detector driver 24 when the level of the external voltage vext from the external voltage source 21 is higher than the operating voltage level. In this case, the switching circuit 25 is turned off, whereas the high voltage detector 11 is turned on. As a result, the high voltage pump circuit 14 is driven to transfer the high voltage Vpp to the high voltage output terminal 15.

The operation of the detector driver 24 in the interval (4) is the same as that in the interval (2). Also, the operation of the detector driver 24 in the interval (5) is the same as that in the interval (1).

Alternatively, in order to obtain the same effect in the high voltage generation circuit, an odd number of inverters may be connected in series between the nodes N2 and N3 in the operating voltage detector 22 in FIG. 3, an even number of inverters may be connected in series between the nodes N5 and N6 in the burn-in test voltage detector 23 in FIG. 4, a NAND gate may be used instead of the NOR gate G1 in the detector driver 24 FIG. 5, and an even number of inverters may be connected in series between the nodes N7 and N8 in the detector driver 24 in FIG. 5.

Figure 7:
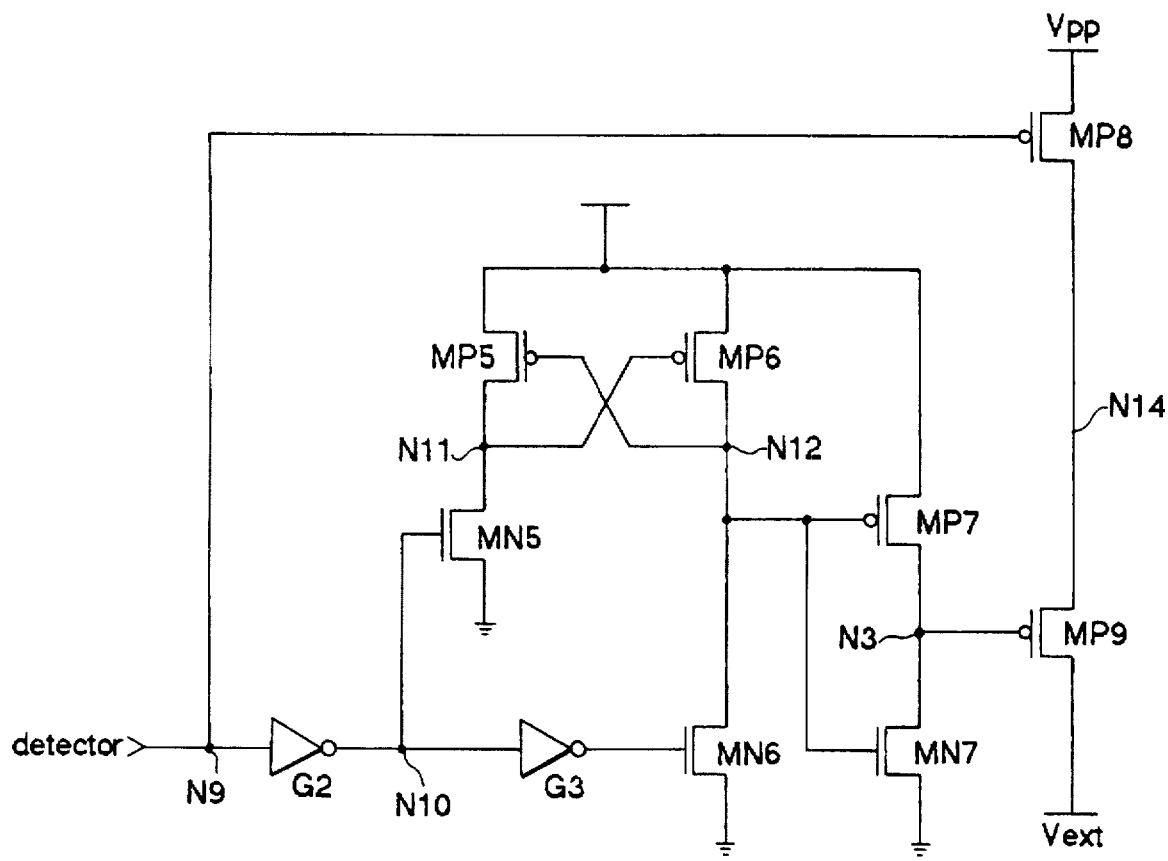
FIG. 7 is a circuit diagram of a switching circuit in FIG. 2.

FIG. 7 is a circuit diagram of the switching circuit 25 in FIG. 2. As shown in this drawing, the switching circuit 25 includes a node N9 for receiving the output signal Detector from the detector driver 24, an inverter G2 connected between the node N9 and a node N10, an inverter G3 for inverting a signal at the node N10, a PMOS transistor MP5 connected between the supply voltage source Vcc and a node N11, and a PMOS transistor MP6 connected between the supply voltage source Vce and a node N12.

The PMOS transistor MP5 has its gate connected to the node N12 and the PMOS transistor MP6 has its gate connected to the node N11.

The switching circuit 25 further includes an NMOS transistor MN5 connected between the node N11 and the ground voltage source Vss, an NMOS transistor MN6 connected between the node N12 and the ground voltage source Vss, a PMOS transistor MP7 connected between the supply voltage source Vcc and a node N13, and an NMOS transistor MN7 connected between the node N13 and the ground voltage source Vss. The NMOS transistor MN5 has its gate connected to the node N10 and the NMOS transistor MN6 has its gate for inputting an output signal from the inverter G3. The PMOS transistor MP7 and NMOS transistor MN7 have their gates connected in common to the node N12.

The switching circuit 25 further includes a PMOS transistor MP8 connected between the high voltage output terminal 15 and a node N14, and a PMOS transistor MP9 connected between the node N14 and the external voltage source 21. The PMOS transistor MP8 has its gate connected to the node N9 and the PMOS transistor MP9 has its gate connected to the node N13.

The operation of the switching circuit 25 with the above-mentioned construction in accordance with the embodiment of the present invention will hereinafter be described in detail.

If the output signal Detector from the detector driver 24 is low in logic, the signal at the node N10 becomes high in logic to turn on the NMOS transistor MN5. As the NMOS transistor MN5 is turned on, a signal at the node N11 becomes low in logic to turn on the PMOS transistor MP6. As the PMOS transistor MP6 is turned on, a signal at the node N12 becomes high in logic. As a result, the NMOS transistor MN7 is turned on, thereby causing a signal at the node N13 to become low in logic. The low logic signal at the node N13 causes the PMOS transistor MP9 to be turned on. Also, the PMOS transistor MP8 is turned on in response to the low logic signal at the node N9. As a result, the external voltage Vext from the external voltage source 21 is transferred to the high voltage output terminal 15.

In contrast, in the case where the output signal Detector from the detector driver 24 is high in logic, the PMOS transistors MP8 and MP9 are both turned off, so that the external voltage Vext from the external voltage source 21 cannot be transferred to the high voltage output terminal 15.

Figure 8A:
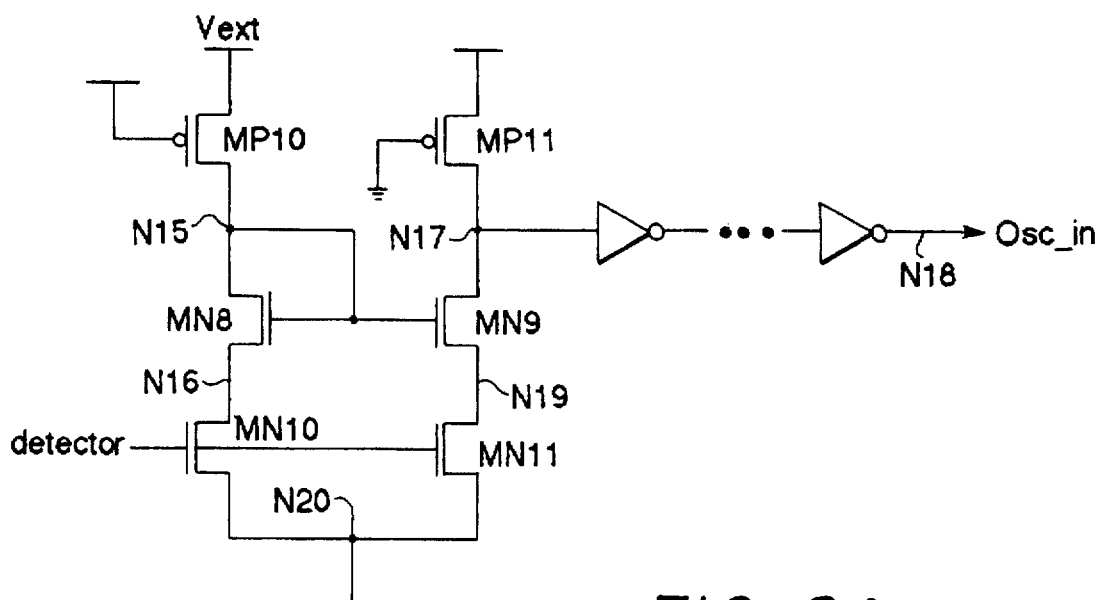
FIGS. 8A and 8B are circuit diagrams illustrating different constructions of a high voltage detector in FIG. 2.

FIG. 8A is a circuit diagram illustrating the construction of the high voltage detector 11 in FIG. 2. As shown in this drawing, the high voltage detector 11 includes a PMOS transistor MP10 connected between the external voltage source 21 and a node N15, a PMOS transistor MP11 connected between the supply voltage source Vcc and a node N17, an NMOS transistor MN8 connected between the node N15 and a node N16, and an NMOS transistor MN9 connected between the node N17 and a node N19. The PMOS transistor MP10 has its gate connected to the supply voltage source Vcc and the PMOS transistor MP11 has its gate connected to the ground voltage source Vss The NMOS transistors MN8 and MN9 have their gates connected in common to the node N15.

The high voltage detector 11 further includes an NMOS transistor MN10 connected between the node N16 and a node N20 which is connected to the ground voltage source Vss, an NMOS transistor MN11 connected between the node N19 and the node N20, and an even number of inverters connected in series between the node N17 and an output node N18. The NMOS transistors MN10 and MN11 have their gates for commonly inputting the output signal Detector from the detector driver 24.

The operation of the high voltage detector 11 with the above-mentioned construction in accordance with the embodiment of the present invention will hereinafter be described in detail.

When the output signal Detector from the detector driver 24 is high in logic, the NMOS transistors MN10 and MN11 are turned on, thereby causing signals at the nodes N16 and N19 to become low in logic. In the case where the level of the external voltage Vext from the external voltage source 21 is lower or higher than the operating voltage level, the PMOS transistor MP10 is turned on to allow a signal at the node N15 to go high in logic. As a result, the NMOS transistors MN8 and MN9 are turned on. Noticeably, a signal at the node N17 is maintained at its high logic state because the PMOS transistor MP11 always remains at its ON state. However, as the NMOS transistors MN9 and MN11 are turned on, the signal at the node N17 makes a high to low transition in logic. As a result, an output signal Osc_in at the output node N18 is made active from high to low in logic to drive the ring oscillator 12. As the ring oscillator 12 is driven, the high voltage pump circuit 14 pumps charge to the high voltage output terminal 15.

In contrast, in the case where the output signal Detector from the detector driver 24 is low in logic, the high voltage detector 11 does not detect the high voltage Vpp, so that it cannot drive the ring oscillator 12.

Figure 8B:
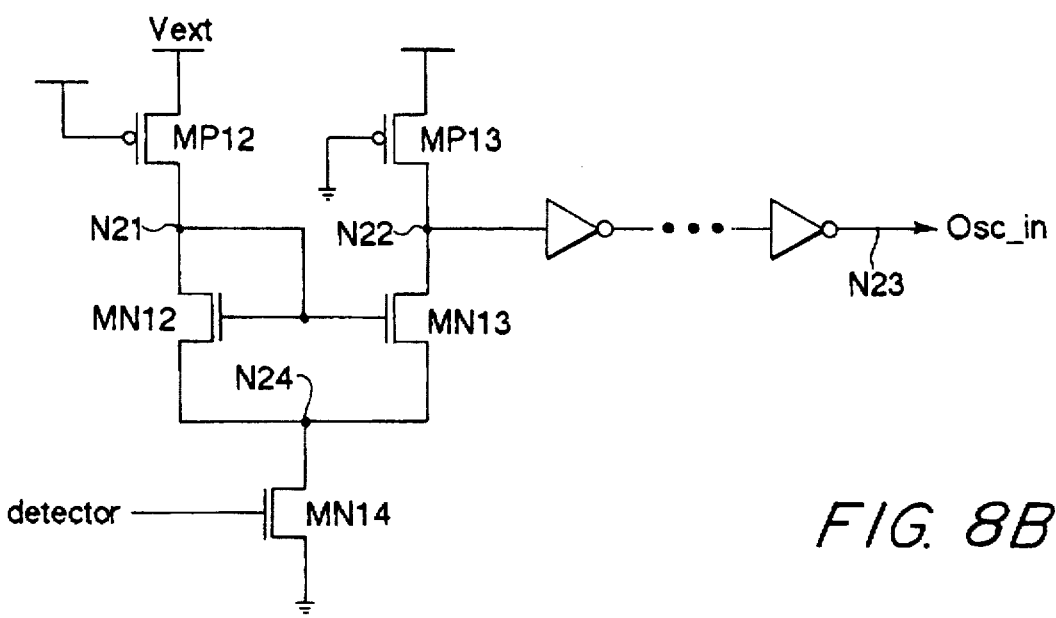

FIG. 8B is a circuit diagram illustrating another construction of the high voltage detector 11 in FIG. 2. As shown in this drawing, the high voltage detector 11 includes a PMOS transistor MP12 connected between the external voltage source 21 and a node N21, a PMOS transistor MP13 connected between the supply voltage source Vcc and a node N22, an NMOS transistor MN12 connected between the node N21 and a node N24, and an NMOS transistor MN13 connected between the node N22 and the node N24. The PMOS transistor MP12 has its gate connected to the supply voltage source Vcc and the PMOS transistor MP13 has its gate connected to the ground voltage source Vss. The NMOS transistors MN12 and MN13 have their gates connected in common to the node N21.

The high voltage detector 11 further includes an NMOS transistor MN14 connected between the node N24 and the ground voltage source Vss, and an even number of inverters connected in series between the node N22 and an output node N23. The NMOS transistor MN14 has its gate for inputting the output signal Detector from the detector driver 24.

The operation of the high voltage detector 11 in FIG. 8B is very similar with that in FIG. 8A and a description thereof will thus be omitted.

Figure 9:
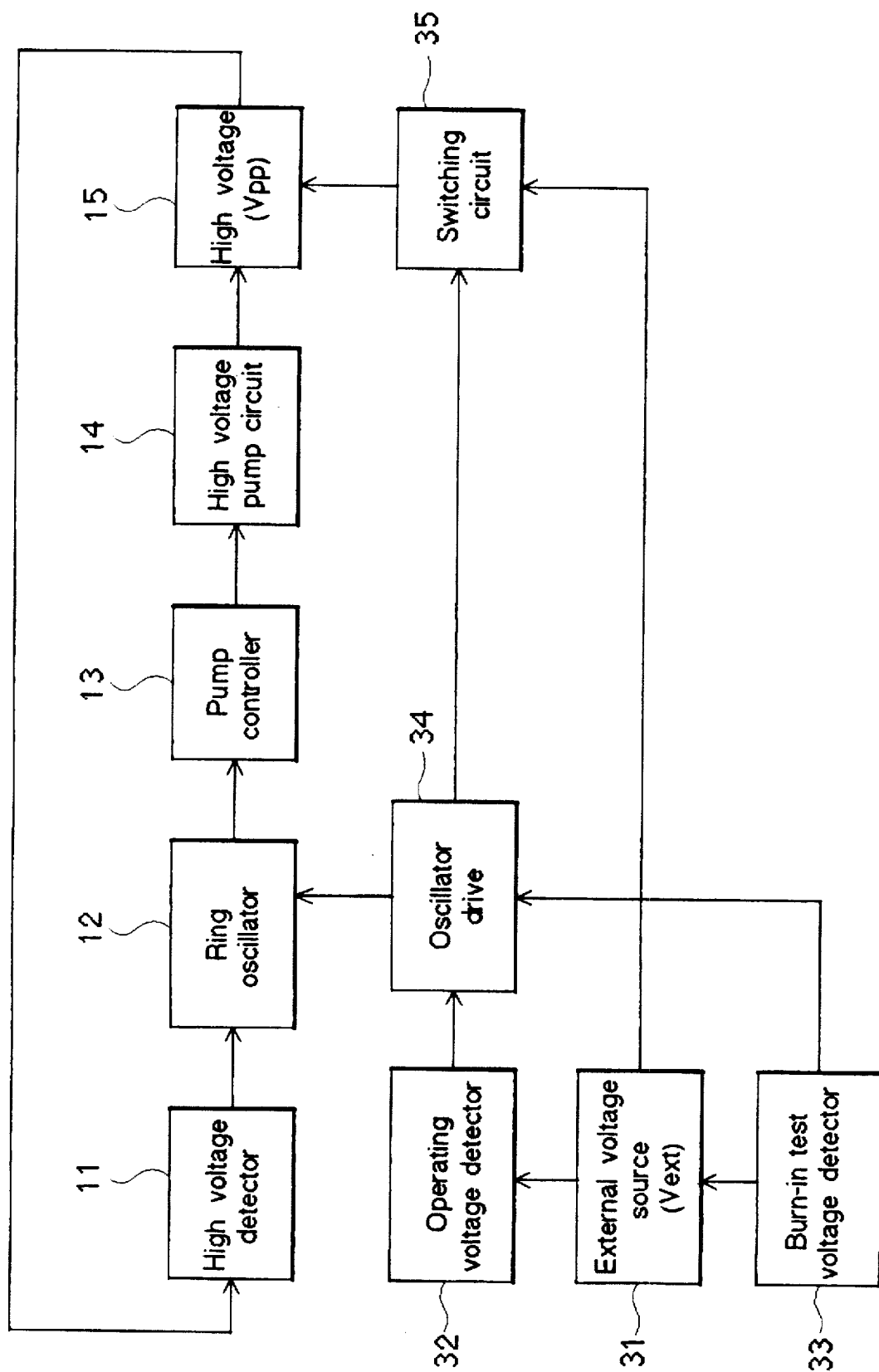
FIG. 9 is a block diagram illustrating the construction of a high voltage generation circuit for a semiconductor memory device in accordance with an alternative embodiment of the present invention.

Referring to FIG. 9, the construction of a high voltage generation circuit for a semiconductor memory device in accordance with an alternative embodiment of the present invention is shown in block form. As shown in this drawing, the high voltage generation circuit comprises a high voltage detector 11 for detecting a high voltage Vpp, a ring oscillator 12 for generating a pulse signal in response to an output signal from the high voltage detector 11 when a power-up signal Pwrup is made active, a high voltage pump circuit 14 for performing a charge pumping operation to generate the high voltage Vpp and transfer the generated high voltage Vpp to a high voltage output terminal 15, and a pump controller 13 for controlling the charge pumping operation of the high voltage pump circuit 14 in response to the pulse signal from the ring oscillator 12.

The high voltage generation circuit further comprises an operating voltage detector 32 for detecting whether an external voltage Vext from an external voltage source 31 has an operating voltage level, a burn-in test voltage detector 33 for detecting whether the external voltage Vext from the external voltage source 31 has a level higher than the operating voltage level, a switching circuit 35 for transferring the external voltage Vext from the external voltage source 31 to the high voltage output terminal 15, and an oscillator driver 34 for selectively driving the ring oscillator 12 and the switching circuit 35 in response to output signals from the operating voltage detector 32 and burn-in test voltage detector 33.

The operation of the high voltage generation circuit for the semiconductor memory device with the above-mentioned construction in accordance with the alternative embodiment of the present invention will hereinafter be described in detail.

In the high voltage generation circuit, the operating voltage detector 32 and the burn-in test voltage detector 33 detect the level of the external voltage Vext from the external voltage source 31 and output the detected results to the oscillator driver 34. In response to the detected results from the operating voltage detector 32 and burn-in test voltage detector 33, the oscillator driver 34 determines which one of the ring oscillator 12 and switching circuit 35 will be driven. When the level of the external voltage Vext from the external voltage source 31 is lower than the operating voltage level, the oscillator driver 34 drives the ring oscillator 12, thereby allowing the high voltage pump circuit 14 to be operated. In the case where the external voltage Vext from the external voltage source 31 has the operating voltage level, the oscillator driver 34 drives the switching circuit 35 to transfer the external voltage Vext from the external voltage source 31 to the high voltage output terminal 15. When the level of the external voltage Vext from the external voltage source 31 is higher than the operating voltage level, the oscillator driver 34 stops the operation of the switching circuit 35 and drives the ring oscillator 12. As a result, the high voltage pump circuit 14 is operated to pump charge to the high voltage output terminal 15.

Figure 10:
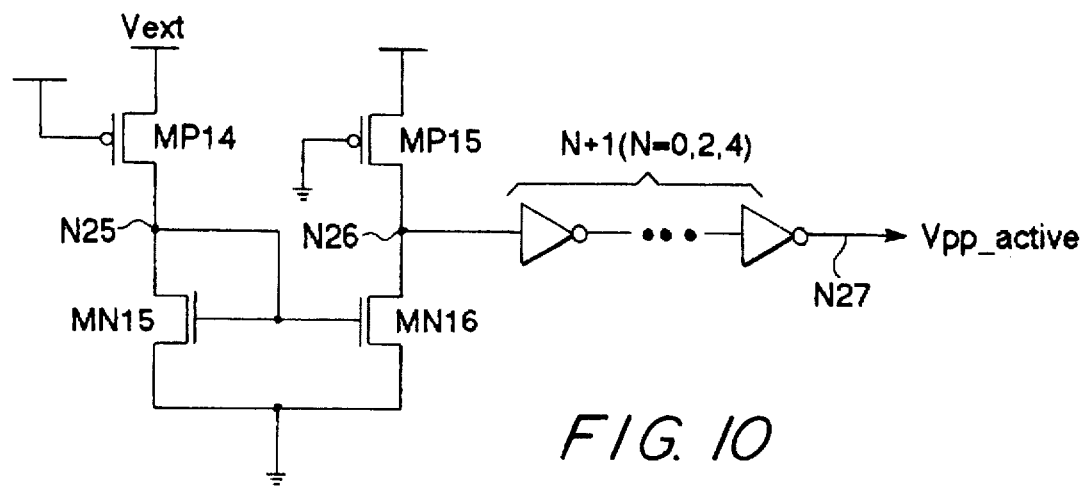
FIG. 10 is a circuit diagram of an operating voltage detector in FIG. 9.

FIG. 10 is a circuit diagram of the operating voltage detector 32 in FIG. 9. As shown in this drawing, the operating voltage detector 32 includes a PMOS transistor MP14 connected between the external voltage source 31 and a node N25, a PMOS transistor MP15 connected between a supply voltage source Vcc and a node N26, an NMOS transistor MN15 connected between the node N25 and a ground voltage source Vss, and an NMOS transistor MN16 connected between the node N26 and the ground voltage source Vss. The PMOS transistor MP14 has its gate connected to the supply voltage source Vcc and the PMOS transistor MP15 has its gate connected to the ground voltage source Vss. The NMOS transistors MN15 and MN16 have their gates connected in common to the node N25.

The operating voltage detector 32 further, includes an odd number of inverters connected in series between the node N26 and an output node N27.

The operation of the operating voltage detector 32 with the above-mentioned construction in accordance with the alternative embodiment of the present invention will hereinafter be described in detail.

When the level of the external voltage Vext from the external voltage source 31 is lower than the operating voltage level, the PMOS transistor MP14 is weakly turned on to supply a feeble voltage to the node N25. The feeble voltage at the node N25 causes the NMOS transistors MN15 and MN16 to be weakly turned on. As the NMOS transistors MN15 and MN16 are weakly turned on, the amount of current flowing to the node N26 through the PMOS transistor MP15 is much larger than that of current discharged to the ground voltage source Vss through the NMOS transistor MN16. As a result, a signal at the node N26 becomes high in logic, thereby causing an output signal Vpp__active at the output node N27 to go low in logic.

However, in the case where the external voltage Vext from the external voltage source 31 has the operating voltage level, the PMOS transistor MP14 and the NMOS transistors MN15 and MN16 are turned on, thereby causing the signal at the node N26 to go from high to low in logic. As a result, the output signal Vpp__active at the output node N27 is made active from low to high in logic. The PMOS transistor MP14 always remains at its ON state when the level of the external voltage Vext from the external voltage source 31 is higher than or equal to the operating voltage level. In this case, the output signal Vpp__active at the output node N27 is always high in logic.

Figure 11:
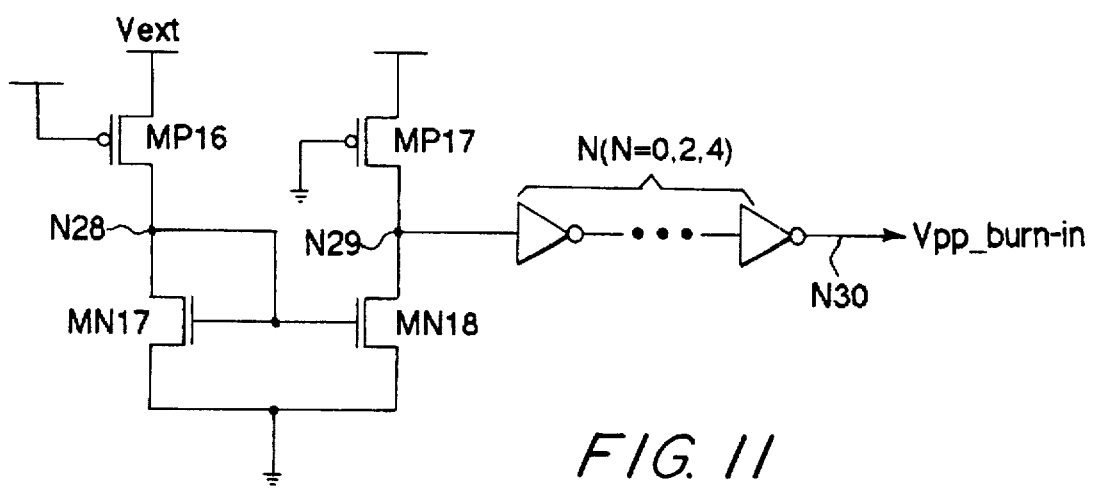
FIG. 11 is a circuit diagram of a burn-in test voltage detector in FIG. 9.

FIG. 11 is a circuit diagram of the burn-in test voltage detector 33 in FIG. 9. As shown in this drawing, the burn-in test voltage detector 33 includes a PMOS transistor MP16 connected between the external voltage source 31 and a node N28, a PMOS transistor MP17 connected between the supply voltage source Vcc and a node N29, an NMOS transistor MN17 connected between the node N28 and the ground voltage source Vss, and an NMOS transistor MN18 connected between the node N29 and the ground voltage source Vss. The PMOS transistor MP16 has its gate connected to the supply voltage source Vcc and the PMOS transistor MP17 has its gate connected to the ground voltage source Vss. The NMOS transistors MN17 and MN18 have their gates connected in common to the node N28.

The burn-in test voltage detector 33 further includes an even number of inverters connected in series between the node N29 and an output node N30.

The operation of the burn-in test voltage detector 33 with the above-mentioned construction in accordance with the alternative embodiment of the present invention will hereinafter be described in detail.

When the level of the external voltage Vext from the external voltage source 31 is higher than the operating voltage level, the PMOS transistor MP16 and the NMOS transistors MN17 and MN18 are turned on, thereby causing a signal at the node N29 to go from high to low in logic. As a result, an output signal Vpp__burn-in at the output node N30 is made active from high to low in logic. In the case where the level of the external voltage Vext from the external voltage source 31 is lower than the operating voltage level, the PMOS transistor MP16 is turned off. In this case, the output signal Vpp__burn-in at the output node N30 is high in logic.

Figure 12:
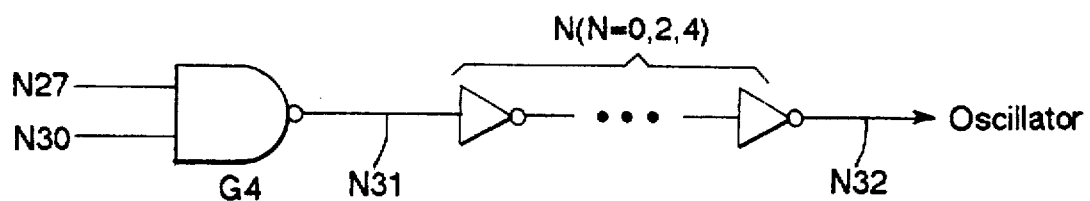
FIG. 12 is a circuit diagram of an oscillator driver in FIG. 9.

FIG. 12 is a circuit diagram of the oscillator driver 34 in FIG. 9. As shown in this drawing, the oscillator driver 34 includes a NAND gate G4 for NANDing the output signal Vpp__active at the output node N27 of the operating voltage detector 32 and the output signal Vpp__burn-in at the output node N30 of the burn-in test voltage detector 33 and outputting the NANDed result to a node N31, and an even number of inverters connected in series between the node N31 and an output node N32.

The operation of the oscillator driver 34 with the above-mentioned construction in accordance with the alternative embodiment of the present invention will hereinafter be described in detail with reference to FIG. 13.

The oscillator driver 34 outputs a high or low logic signal Oscillator at its output node N32 in response to the output signal Vpp__active at the output node N27 of the operating voltage detector 32 and the output signal Vpp__burn-in at the output node N30 of the burn-in test voltage detector 33. The low logic signal Oscillator at the output node N32 allows the high voltage pump circuit 14 to be driven to transfer the high voltage Vpp to the high voltage output terminal 15. The high logic signal Oscillator at the output node N32 allows the switching circuit 35 to be driven to transfer the external voltage Vext from the external voltage source 31 to the high voltage output terminal 15.

Figure 13:
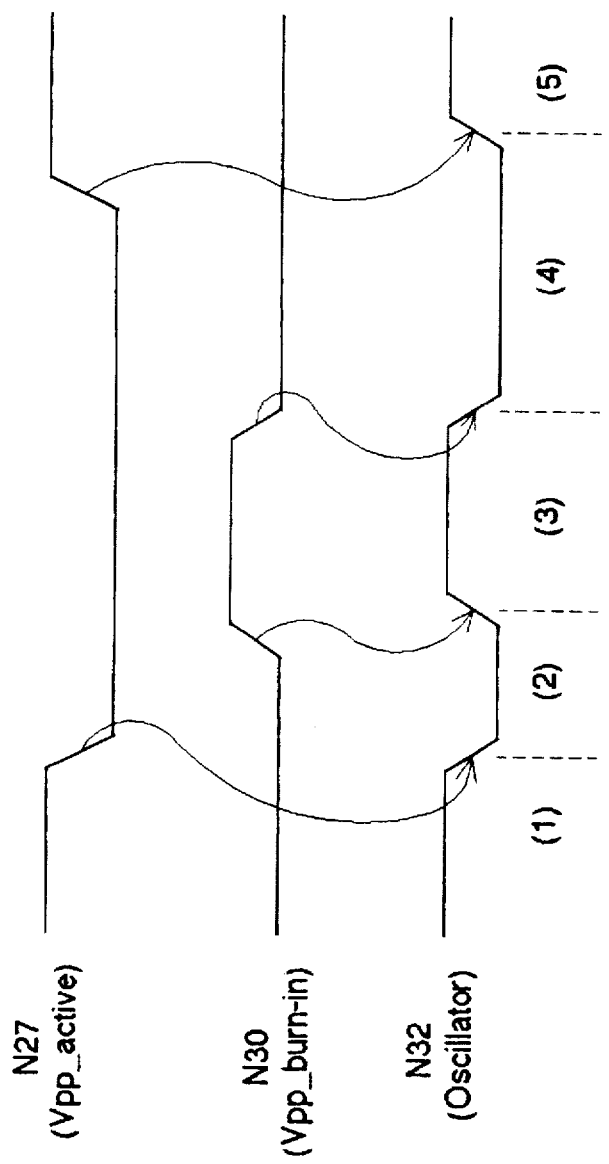
FIG. 13 is a timing diagram illustrating the operation of the oscillator driver in FIG. 12.

FIG. 13 is a timing diagram illustrating the operation of the oscillator driver 34 in FIG. 12. In this drawing, the interval (1) shows the operation of the oscillator driver 34 when the level of the external voltage Vext from the external voltage source 31 is lower than the operating voltage level. In this case, the switching circuit 35 is turned off, whereas the ring oscillator 12 is turned on. As a result, the high voltage pump circuit 14 is driven to transfer the high voltage Vpp to the high voltage output terminal 15.

The interval (2) shows the operation of the oscillator driver 34 when the level of the external voltage Vext from the external voltage source 31 is equal to the operating voltage level. In this case, the switching circuit 35 is turned on, whereas the ring oscillator 12 is turned off. As a result, the high voltage pump circuit 14 is stopped in operation and the external voltage Vext from the external voltage source 31 is transferred to the high voltage output terminal 15.

The interval (3) shows the operation of the oscillator driver 34 when the level of the external voltage Vext from the external voltage source 31 is higher than the operating voltage level. In this case, the switching circuit 35 is turned off, whereas the ring oscillator 12 is turned on. As a result, the high voltage pump circuit 14 is driven to transfer the high voltage Vpp to the high voltage output terminal 15.

The operation of the oscillator driver 34 in the interval (4) is the same as that in the interval (2). Also, the operation of the oscillator driver 34 in the interval (5) is the same as that in the interval (1).

Alternatively, in order to obtain the same effect in the high voltage generation circuit, an even number of inverters may be connected in series between the nodes N26 and N27 in the operating voltage detector 32 in FIG. 10, an odd number of inverters may be connected in series between the nodes N29 and N30 in the burn-in test voltage detector 33 in FIG. 11, a NOR gate may be used instead of the NAND gate G4 in the oscillator driver 34 in FIG. 12, and an odd number of inverters may be connected in series between the nodes N31 and N32 in the oscillator driver 34 in FIG. 12.

Figure 14:
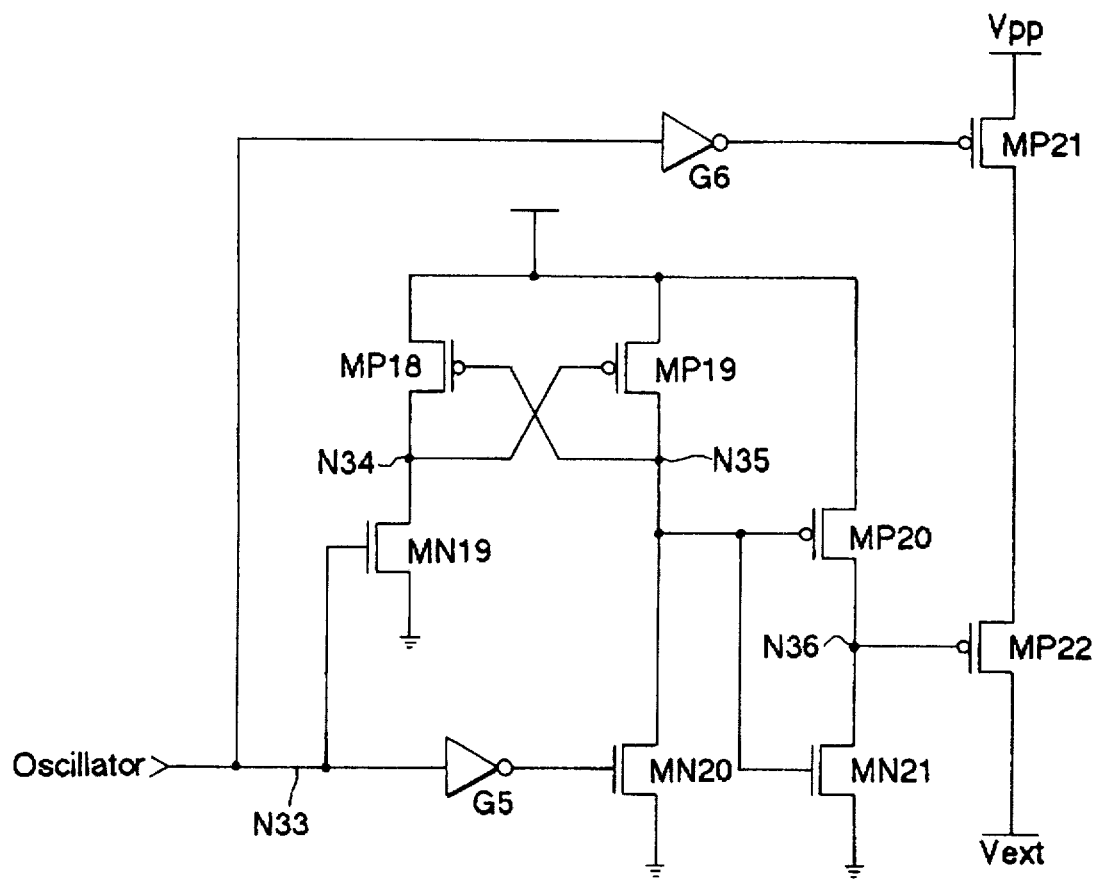
FIG. 14 is a circuit diagram of a switching circuit in FIG. 9.

FIG. 14 is a circuit diagram of the switching circuit 35 in FIG. 9. As shown in this drawing, the switching circuit 35 includes a node N33 for receiving the output signal Oscillator from the oscillator driver 34, inverters G5 and G6 connected in parallel to the node N33, a PMOS transistor MP18 connected between the supply voltage source Vcc and a node N34, and a PMOS transistor MP19 connected between the supply voltage source Vcc and a node N35. The PMOS transistor MP18 has its gate connected to the node N35 and the PMOS transistor MP19 has its gate connected to the node N34.

The switching circuit 35 further includes an NMOS transistor MN19 connected between the node N34 and the ground voltage source Vss, an NMOS transistor MN20 connected between the node N35 and the ground voltage source Vss, a PMOS transistor MP20 connected between the supply voltage source Vcc and a node N36, and an NMOS transistor MN21 connected between the node N36 and the ground voltage source Vss. The NMOS transistor MN19 has its gate connected to the node N33 and the NMOS transistor MN20 has its gate for inputting an output signal from the inverter G5. The PMOS transistor MP20 and NMOS transistor MN21 have their gates connected in common to the node N35.

The switching circuit 35 further includes a PMOS transistor MP21 connected between the high voltage output terminal 15 and a node N37, and a PMOS transistor MP22 connected between the node N37 and the external voltage source 31. The PMOS transistor MP21 has its gate for inputting an output signal from the inverter G6 and the PMOS transistor MP22 has its gate connected to the node N36.

The operation of the switching circuit 35 with the above-mentioned construction in accordance with the alternative embodiment of the present invention will hereinafter be described in detail.

When the output signal Oscillator from the oscillator driver. 34 is high in logic, the PMOS transistor MP21 and the NMOS transistor MN19 are turned on. As the NMOS transistor MN19 is turned on, a signal at the node N34 becomes low in logic to turn on the PMOS transistor MP19. As the PMOS transistor MP19 is turned on, a signal at the node N35 becomes high in logic. As a result, the NMOS transistor MN21 is turned on, thereby causing a signal at the node N36 to become low in logic. The low logic signal at the node N36 causes the PMOS transistor MP22 to be turned on. As a result, the external voltage Vext from the external voltage source 31 is transferred to the high voltage output terminal 15.

In contrast, in the case where the output signal Oscillator from the oscillator driver 34 is low in logic, the PMOS transistors MP21 and MP22 are both turned off, so that the external voltage Vext from the external voltage source 31 cannot be transferred to the high voltage output terminal 15.

Figure 15:
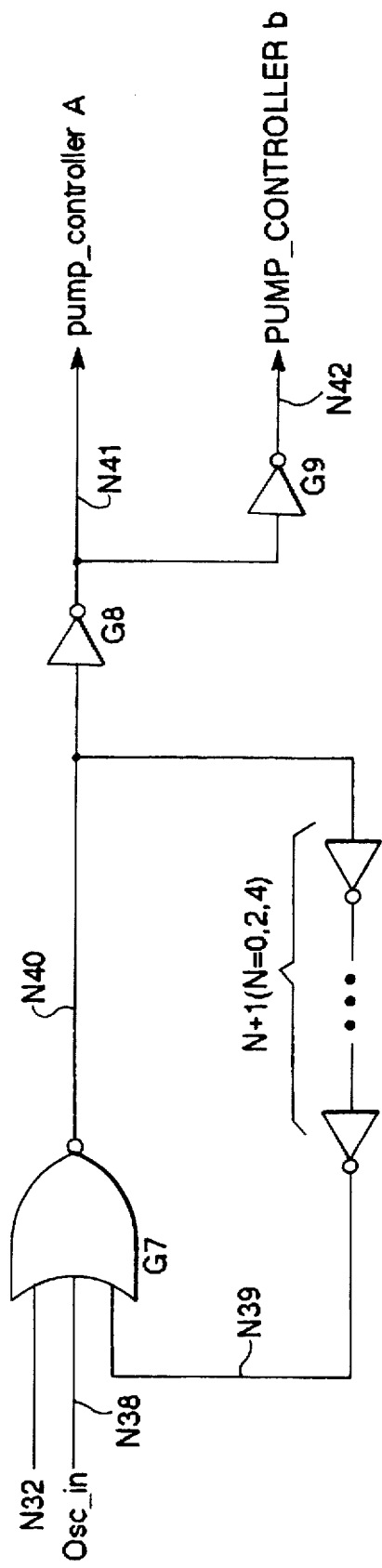
FIG. 15 is a circuit diagram of a ring oscillator in FIG. 9.

FIG. 15 is a circuit diagram of the ring oscillator 12 in FIG. 9. As shown in this drawing, the ring oscillator 12 includes a NOR gate G7 for NORing the output signal Oscillator at the output node N32 of the oscillator driver 34, the output signal Osc_in from the high voltage detector 11 at a node N38 and a signal at a node N39 and outputting the NORed result to a node N40, an odd number of inverters connected in series between the nodes N40 and N39, an inverter G8 connected between the node N40 and a first output node N41, and an inverter G9 connected between the first output node N41 and a second output node N42.

The operation of the ring oscillator 12 with the above-mentioned construction in accordance with the alternative embodiment of the present invention will hereinafter be described in detail.

When the output signal oscillator from the oscillator driver 34 is high in logic, the ring oscillator 12 produces no pulse signal. As a result, a signal at the first output node N41 is maintained at its high logic state and a signal at the second output node N42 is maintained at its low logic state, so that the high voltage pump circuit 14 cannot be operated. To the contrary, in the case where the output signal Oscillator from the oscillator driver 34 is low in logic, the ring oscillator 12 produces a pulse signal at a fixed period. In this case, if the output signal Osc_in from the high voltage detector 11 is high in logic, a signal at the node N40 becomes low in logic, resulting in the production of no pulse signal. As a result, the signal at the first output node N41 is maintained at its high logic state and the signal at the second output node N42 is maintained at its low logic state, so that the high voltage pump circuit 14 cannot be operated.

As is apparent from the above description, according to the present invention, when the external voltage has the operating voltage level, the high voltage generation circuit for the semiconductor memory device supplies the external voltage directly as the high voltage without operating the pump circuit. Therefore, the power consumption amount can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A high voltage generation circuit for a semiconductor memory device comprising high voltage detection means for detecting a high voltage, ring oscillation means for generating a pulse signal in response to an output signal from said high voltage detection means when a power-up signal is made active, high voltage pump means for performing a charge pumping operation to generate the high voltage and transfer the generated high voltage to a high voltage output terminal, and pump control means for controlling the charge pumping operation of said high voltage pump means in response to the pulse signal from said ring oscillation means, wherein the improvement comprises:

operating voltage detection means for detecting whether an external voltage from an external voltage source has an operating voltage level;

burn-in test voltage detection means for detecting whether the external voltage from said external voltage source has a level higher than the operating voltage level;

switching means for transferring the external voltage from said external voltage source to said high voltage output terminal; and drive means for selectively driving said high voltage detection means and said switching means in response to output signals from said operating voltage detection means and burn-in test voltage detection means.

2. A high voltage generation circuit for a semiconductor memory device as set forth in claim 1, wherein said operating voltage detection means includes:

a first MOS transistor connected between said external voltage source and a first node, said first MOS transistor having its gate connected to a supply voltage source;

a second MOS transistor connected between said supply voltage source and a second node, said second MOS transistor having its gate connected to a ground voltage source;

a third MOS transistor connected between said first node and said ground voltage source, said third MOS transistor having its gate connected to said first node;

a fourth MOS transistor connected between said second node and said ground voltage source, said fourth MOS transistor having its gate connected to said first node; and an even number of inverters connected in series between said second node and a third node.

3. A high voltage generation circuit for a semiconductor memory device as set forth in claim 2, wherein said first and second MOS transistors are PMOS transistors and said third and fourth MOS transistors are NMOS transistors.

4. A high voltage generation circuit for a semiconductor memory device as set forth in claim 1, wherein said burn-in test voltage detection means includes;

a first MOS transistor connected between said external voltage source and a first node, said first MOS transistor having its gate connected to a supply voltage source;

a second MOS transistor connected between said supply voltage source and a second node, said second MOS transistor having its gate connected to a ground voltage source;

a third MOS transistor connected between said first node and said ground voltage source, said third MOS transistor having its gate connected to said first node;

a fourth MOS transistor connected between said second node and said ground voltage source, said fourth MOS transistor having its gate connected to said first node; and an odd number of inverters connected in series between said second node and a third node.

5. A high voltage generation circuit for a semiconductor memory device as set forth in claim 4, wherein said first and second MOS transistors are PMOS transistors and said third and fourth MOS transistors are NMOS transistors.

6. A high voltage generation circuit for a semiconductor memory device as set forth in claim 1, wherein said drive means includes:

a NOR gate for NORing the output signal from said operating voltage detection means and the output signal from said burn-in test voltage detection means and outputting the NORed result to a first node; and an odd number of inverters connected in series between said first node and a second node.

7. A high voltage generation circuit for a semiconductor memory device as set forth in claim 1, wherein said switching means includes:

a first node for receiving an output signal from said drive means;

a first inverter connected between said first node and a second node;

a second inverter for inverting a signal at said second node;

a first MOS transistor connected between a supply voltage source and a third node, said first MOS transistor having its gate connected to a fourth node;

a second MOS transistor connected between said supply voltage source and said fourth node, said second MOS transistor having its gate connected to said third node;

a third MOS transistor connected between said third node and a ground voltage source, said third MOS transistor having its gate connected to said second node;

a fourth MOS transistor connected between said fourth node and said ground voltage source, said fourth MOS transistor hating its gate for inputting an output signal from said second inverter;

a fifth MOS transistor connected between said supply voltage source and a fifth node, said fifth MOS transistor having its gate connected to said fourth node;

a sixth MOS transistor connected between said fifth node and said ground voltage source, said sixth MOS transistor having its gate connected to said fourth node;

a seventh MOS transistor connected between said high voltage output terminal and a sixth node, said seventh MOS transistor having its gate connected to said first node; and an eighth MOS transistor connected between said sixth node and said external voltage source, said eighth MOS transistor having its gate connected to said fifth node.

8. A high voltage generation circuit for a semiconductor memory device as set forth in claim 7, wherein said first, second, fifth, seventh and eighth MOS transistors are PMOS transistors and said third, fourth and sixth MOS transistors are NMOS transistors.

9. A high voltage generation circuit for a semiconductor memory device as set forth in claim 1, wherein said high voltage detection means includes:

a first MOS transistor connected between said external voltage source and a first node, said first MOS transistor having its gate connected to a supply voltage source;

a second MOS transistor connected between said supply voltage source and a second node, said second MOS transistor having its gate connected to a ground voltage source;

a third MOS transistor connected between said first node and a third node, said third MOS transistor having its gate connected to said first node;

a fourth MOS transistor connected between said second node and a fourth node, said fourth MOS transistor having its gate connected to said first node;

a fifth MOS transistor connected between said third node and said ground voltage source, said fifth MOS transistor having its gate for inputting an output signal from said drive means;

a sixth MOS transistor connected between said fourth node and said ground voltage source, said sixth MOS transistor having its gate for inputting the output signal from said drive means; and an even number of inverters connected in series between said second node and a fifth node.

10. A high voltage generation circuit for a semiconductor memory device as set forth in claim 9, wherein said first and second MOS transistors are PMOS transistors and said third to sixth MOS transistors are NMOS transistors.

11. A high voltage generation circuit for a semiconductor memory device as set forth in claim 1, wherein said high voltago detection means includes;

a first MOS transistor connected between said external voltage source and a first node, said first MOS transistor having its gate connected to a supply voltage source;

a second MOS transistor connected between said supply voltage source and a second node, said second MOS transistor having its gate connected to a ground voltage source;

a third MOS transistor connected between said first node and a third node, said third MOS transistor having its gate connected to said first node;

a fourth MOS transistor connected between said second node and said fourth node, said fourth MOS transistor having its gate connected to said first node;

a fifth MOS transistor connected between said third node and said ground voltage source, said fifth MOS transistor having its gate for inputting an output signal from said drive means; and an even number of inverters connected in series between said second node and a fourth node.

12. A high voltage generation circuit for a semiconductor memory device as set forth in claim 11, wherein said first and second MOS transistors are PMOS transistors and said third to fifth MOS transistors are NMOS transistors.

13. A high voltage generation circuit for a semiconductor memory device comprising high voltage detection means for detecting a high voltage, ring oscillation means for generating a pulse signal in response to an output signal from said high voltage detection means when a power-up signal is made active, high voltage pump means for performing a charge pumping operation to generate the high voltage and transfer the generated high voltage to a high voltage output terminal, and pump control means for controlling the charge pumping operation of said high voltage pump means in response to the pulse signal from said ring oscillation means, wherein the improvement comprises:

operating voltage detection means for detecting whether an external voltage from an external voltage source has an operating voltage level;

burn-in test voltage detection means for detecting whether the external voltage from said external voltage source has a level higher than the operating voltage level;

switching means for transferring the external voltage from said external voltage source to said high voltage output terminal; and drive means for selectively driving said ring oscillation means and said switching means in response to output signals from said operating voltage detection means and burn-in test voltage detection means.

14. A high voltage generation circuit for a semiconductor memory device as set forth in claim 13, wherein said switching means includes:

a first node for receiving an output signal from said drive means;

first and second inverters connected in parallel to said first node;

a first MOS transistor connected between a supply voltage source and a second node, said first MOS transistor having its gate connected to a third node;

a second MOS transistor connected between said supply voltage source and said third node, said second MOS transistor having its gate connected to said second node;

a third MOS transistor connected between said second node and a ground voltage source, said third MOS transistor having its gate connected to said first node;

a fourth MOS transistor connected between said third node and said ground voltage source, said fourth MOS transistor having its gate for inputting an output signal from said first inverter;

a fifth MOS transistor connected between said supply voltage source and a fourth node, said fifth MOS transistor having its gate connected to said third node;

a sixth MOS transistor connected between said fourth node and said ground voltage source, said sixth MOS transistor having its gate connected to said third node;

a seventh MOS transistor connected between said high voltage output terminal and a fifth node, said seventh MOS transistor having its gate for inputting an output signal from said second inverter; and an eighth MOS transistor connected between said fifth node and said external voltage source, said eighth MOS transistor having its gate connected to said fourth node.

15. A high voltage generation circuit for a semiconductor memory device as set forth in claim 13, wherein said drive means includes:

a NAND gate for NANDing the output signal from said operating voltage detection means and the output signal from said burn-in test voltage detection means and outputting the NANDed result to a first node; and an even number of inverters connected in series between said first node and a second node.

16. A high voltage generation circuit for a semiconductor memory device as set forth in claim 13, wherein said ring oscillation means includes:

a NOR gate for NORing output signals from said drive means and high voltage detection means and a signal at a first node and outputting the NORed result to a second node;

an odd number of first inverters connected in series between said second node and said first node;

a second inverter connected between said second node and a third node; and a third inverter connected between said third node and a fourth node.

17. A high voltage generation circuit for a semiconductor memory device as set forth in claim 14, wherein said first, second, fifth, seventh and eighth MOS transistors are PMOS transistors and said third, fourth and sixth MOS transistors are NMOS transistors.

* * * * *